(12) United States Patent
Otake et al.

(10) Patent No.: US 6,868,780 B2
(45) Date of Patent: Mar. 22, 2005

(54) SCREEN PRINTING METHOD INCLUDING VARIABLE SPEED PLATE SEPARATING OPERATION

(75) Inventors: Yuji Otake, Fukuoka (JP); Seiichi Miyahara, Kurume (JP); Akira Maeda, Kasuga (JP); Masayuki Mantani, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/647,633

(22) Filed: Aug. 25, 2003

(65) Prior Publication Data

US 2004/0040455 A1 Mar. 4, 2004

(30) Foreign Application Priority Data

Aug. 30, 2002 (JP) .................................... P. 2002-254315

(51) Int. Cl.[7] .............................. B41M 1/12; B41F 15/18
(52) U.S. Cl. ...................... 101/129; 101/126; 101/123
(58) Field of Search ............................... 101/123, 124, 101/126, 129, 114, 474; 427/96, 282

(56) References Cited

U.S. PATENT DOCUMENTS

| | | | | |
|---|---|---|---|---|
| 4,902,371 A | * | 2/1990 | Andris et al. ................ | 156/344 |
| 5,174,201 A | * | 12/1992 | Andris et al. ................ | 101/114 |
| 5,623,872 A | | 4/1997 | Tomomatsu ................. | 101/126 |
| 5,735,203 A | * | 4/1998 | Taniguchi et al. ........... | 101/126 |
| 6,129,014 A | * | 10/2000 | Tani ........................... | 101/126 |
| 6,412,408 B1 | * | 7/2002 | Tanaka ....................... | 101/126 |

FOREIGN PATENT DOCUMENTS

| | | | | |
|---|---|---|---|---|
| EP | 0 740 495 A | | 10/1996 | |
| JP | 3-75148 | * | 3/1991 | ................. 101/129 |
| JP | 04-236490 | * | 8/1992 | |

* cited by examiner

*Primary Examiner*—Leslie J. Evanisko
(74) *Attorney, Agent, or Firm*—Pearne & Gordon LLP

(57) ABSTRACT

In a screen printing method of bringing a mask plate into contact with a substrate to print solder cream through a pattern hole on the substrate, a plate separating operation of separating the substrate from the mask plate after a squeegeeing step in which the solder cream is filled into the pattern hole comprises an operation pattern in which acceleration and deceleration pattern in which a descending speed is accelerated up to an upper limit speed and thereafter decelerated up to a lower limit speed is repeated plural times. Further, an initial upper limit speed in start of the plate separating operation is set higher than the succeeding upper limit speeds, whereby viscosity of the solder cream into the pattern hole in start of the plate separating operation is lowered, and the mask plate can be separated with a high accuracy throughout the entire range of the substrate.

6 Claims, 7 Drawing Sheets

SCREEN PRINTING METHOD INCLUDING VARIABLE SPEED PLATE SEPARATING OPERATION

BACKGROUND OF THE INVENTION

The present invention relates to a screen printing method in which paste such solder cream is printed on a work.

As a soldering method of electronic parts, a method by solder bump or solder pre-coating is known. In this method, on an electrode of a work such as electron parts or a substrate, a solder bump that is a protruding electrode of solder for soldering, or solder pre-coating that is solder coating is formed. As a solder supply method in this solder forming process, a screen printing is widely used. In this method, solder cream is printed on the upper surface of the work through a pattern hole provided for a mask plate.

Recently, fining of electronic parts is advancing, a pitch of electrodes formed in a work is also fined, and many electrodes are arranged at a high density. A mask plate used in order to form bumps on these electrodes is much smaller in mask thickness than a conventional mask plate used in solder printing on a print-circuit board. However, in case that the conventional screen printing method is applied intactly to screen printing which uses a mask plate having a thin mask thickness for the work in which such the electrodes having the high density are formed, the following problems are produced.

In order to secure good quality of printing in the screen printing, filling ability of surely filling solder cream in a pattern hole, and good plate separativeness in which the solder cream is separated from the pattern hole with its shape kept when the mask plate is separated from the work after the filling operation are required. However, as the electrodes are arranged at a higher density and the mask is made thinner, difficulty in printing is increasing. Particularly, it is very difficult to secure uniform and good plate separativeness throughout the entire surface of the work.

SUMMARY OF THE INVENTION

Therefore, an object of the invention is to provide a screen printing method which can secure good plate separativeness.

A screen printing method of the invention is a screen printing method of bringing a work into contact with a lower surface of a mask plate in which pattern holes are formed and printing paste on the work through the pattern holes. This method comprises a mask attachment step in which the work is brought into contact with the lower surface of the mask plate; a squeegeeing step in which a squeegee is moved on the mask plate in the mask attachment state thereby to filling paste into the pattern holes; and a plate separating step in which the work is separated from the mask plate stepwise by a plate separating operation of repeating plural times an acceleration and deceleration pattern in which a moving speed at which the work is moved in the direction where the work separates from the mask plate is accelerated up to an upper limit speed and thereafter is decelerated up to a lower limit speed. Further, an initial upper limit speed representing the upper limit speed in start of the plate separating operation is set higher than succeeding upper limit speeds representing the upper limit speeds from the middle of the plate separating operation on.

Further, a screen printing method of the invention is a screen printing method of bringing a work into contact with a lower surface of a mask plate in which pattern holes are formed and printing paste on the work through the pattern holes, and this method comprises a mask attachment step in which the work is brought into contact with the lower surface of the mask plate; a squeegeeing step in which a squeegee is moved on the mask plate in the mask attachment state thereby to filling paste into the pattern holes; and a plate separating step in which a plate separating operation of moving the work in the direction where the work separates from the mask plate is performed. Further, in start of the plate separating operation, the moving speed is accelerated up to an upper limit speed and thereafter is decelerated up to a lower limit speed.

According to the invention, in start of the plate separating operation of moving the work in the direction where the work separates from the mask plate, the moving speed is accelerated up to the upper limit speed and thereafter is decelerated up to the lower limit speed, whereby viscosity of the paste into the pattern hole is lowered in start of the plate separating operation, and good plate separativeness can be secured throughout the entire range of the substrate.

DESCRIPTION OF THE PREFERRED EMBODIMENT

Figure 1:
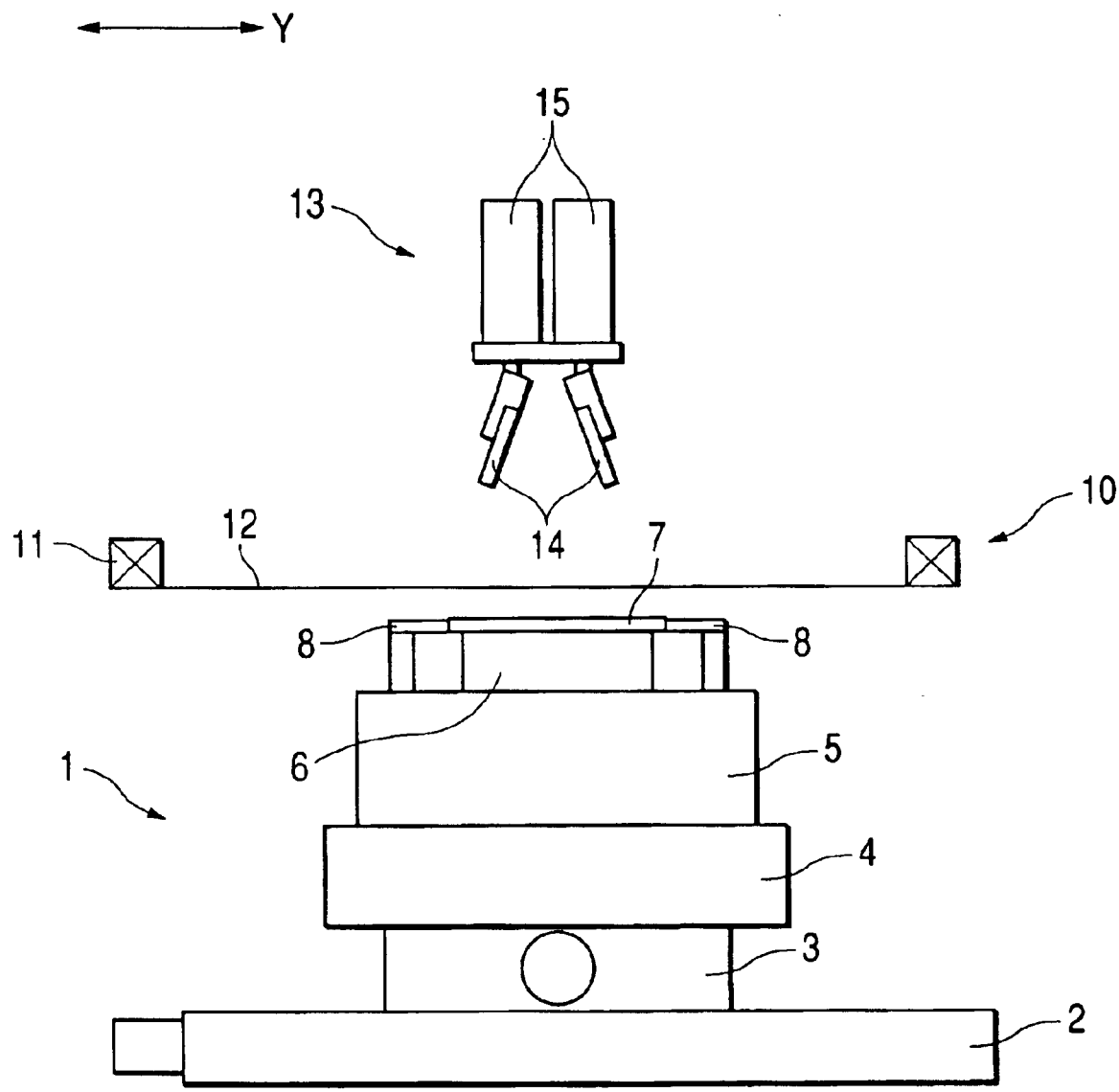
FIG. 1 is a partially sectional view of a screen printing apparatus according to one embodiment of the invention.
Figure 2:
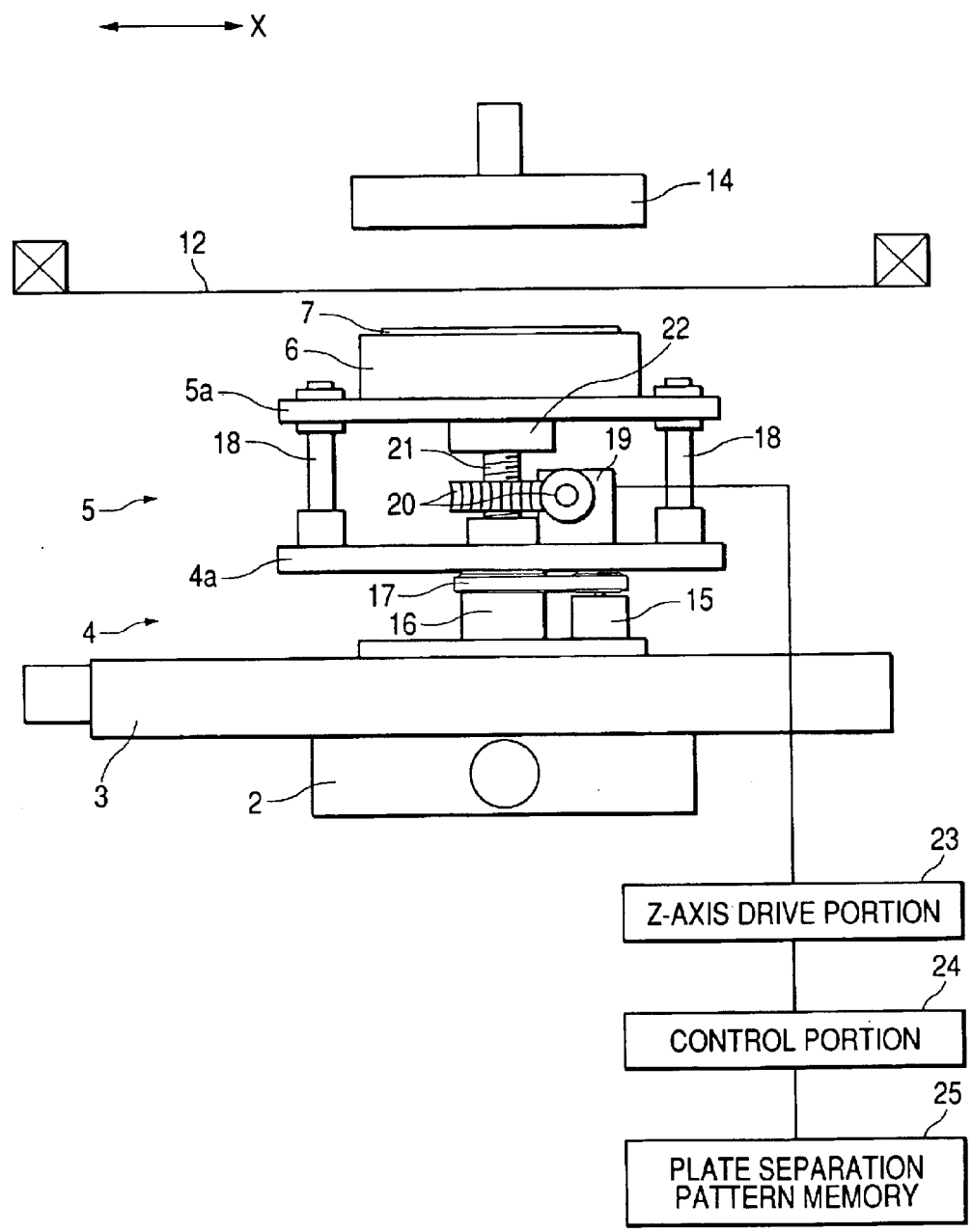
FIG. 2 is a partially sectional view of the screen printing apparatus according to one embodiment of the invention.

Next, an embodiment of the invention will be described with reference to drawings. FIG. 1 and FIG. 2 are partial sectional views of a screen printing apparatus in one embodiment of the invention, FIG. 3A to FIG. 3E are figures showing a screen printing operation in the screen printing apparatus in one embodiment of the invention, FIG. 4A to FIG. 4C are a diagram and figures showing a plate separating operation in the screen printing operation in one embodiment of the invention, and FIG. 5A to FIG. 5C, FIG. 6, and FIG. 7A to FIG. 7E are diagrams showing plate separating patterns in the screen printing operation in one embodiment of the invention.

Referring first to FIG. 1 and FIG. 2, structure of the screen printing apparatus will be described. In FIG. 1, a substrate positioning portion 1 comprises a Y-axis table 2, an X-axis table 3, an q-axis table 4 and a Z-axis table 5, and they are superimposed. On the Z-axis table 5, a substrate receiving portion 6 is arranged, which receives a downside of a substrate 7 that is a work to be printed and holds the substrate 7. The substrate 7 on the substrate receiving portion 6 is clamped by a clamper 8.

As shown in FIG. 2, the q-axis table 4 includes a rotary plate 4a which q-rotates about a vertical axis by a shaft portion 16, and the shaft portion 16 is rotation-driven through a belt 17 by a q-motor 15 thereby to q-rotate the rotary plate 4a about a vertical axis. The Z-axis table 5 includes a up-and-down plate 5a which is guided by a slide shaft 18 thereby to go up and down, and a vertical feed screw 21 is fitted to a nut 22 fixed to the up-and-down plate 5a. The feed screw 21 is rotation-driven through a worm mechanism 20 by a Z-motor 19, and drive of the Z-motor 19 moves the up-and-down plate 5a up and down, whereby the substrate 7 on the substrate receiving portion 6 goes up and down.

The Z-motor 19 is driven by a Z-axis drive portion 23, and the Z-axis drive portion 23 is controlled by a control section 24. Into a plate separation pattern memory 25, a plate separating operation pattern which will be described later is stored. In a screen printing operation, the control section 24 controls the Z-axis drive portion 23 on the basis of the plate separating operation pattern, whereby the plate separating operation of separating the substrate 7 from a mask plate 12 can be performed at the predetermined operation pattern.

Above the substrate positioning portion 1, a screen printing section 10 is provided. The screen printing section 10 includes a mask plate 12 held by a frame-shaped holder 11. On the mask plate 12, a squeegee unit 13 is provided movably in a Y-direction by a squeegee moving table (not shown). As shown in FIG. 1, the squeegee unit 13 includes a pair of squeegees 14 that moves up and down by a cylinder 15. In a state where the substrate 7 is brought into contact with the lower surface of the mask plate 12, the cylinder 15 is driven, whereby the squeegee 14 descends and its lower end portion comes into contact with the upper surface of the mask plate 12.

Referring next to FIG. 3A to FIG. 3E, the screen printing operation will be described. In the screen printing to be performed here, solder cream is printed on the substrate 7 in order to form solder bump on the substrate 7, and a thin type of mask plate 12 in which pattern holes 12a are formed at a high density is used. Printing by this type of mask plate is high in difficulty, and particularly in the plate separating operation after squeegeeing, it is difficult to perform uniform plate separation throughout the entire range of the substrate.

Namely, though tack force is large in plate separation because of the pattern holes provided at the high density, since the mask plate itself is thin and easy to bend, the mask plate is easy to be pulled downward in the plate separating time when the substrate is caused to descend. Consequently, a difference in timing of plate separation is produced between the peripheral portion of the substrate and the center portion thereof, so that it is difficult to set appropriately the condition of uniform plate separation. The screen printing shown in the embodiment is applied to such the screen printing for forming solder bump having the high difficulty, and security of good and uniform plate separativeness is realized by the following method.

Figure 3A:
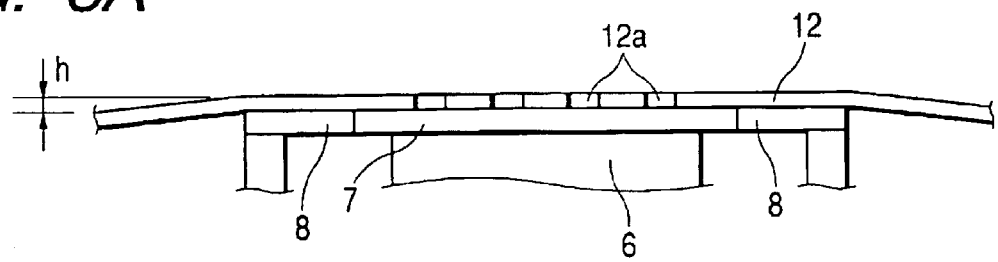
FIG. 3A to FIG. 3E are figures for explaining a screen printing operation in the screen printing apparatus according to one embodiment of the invention.
Figure 4A:
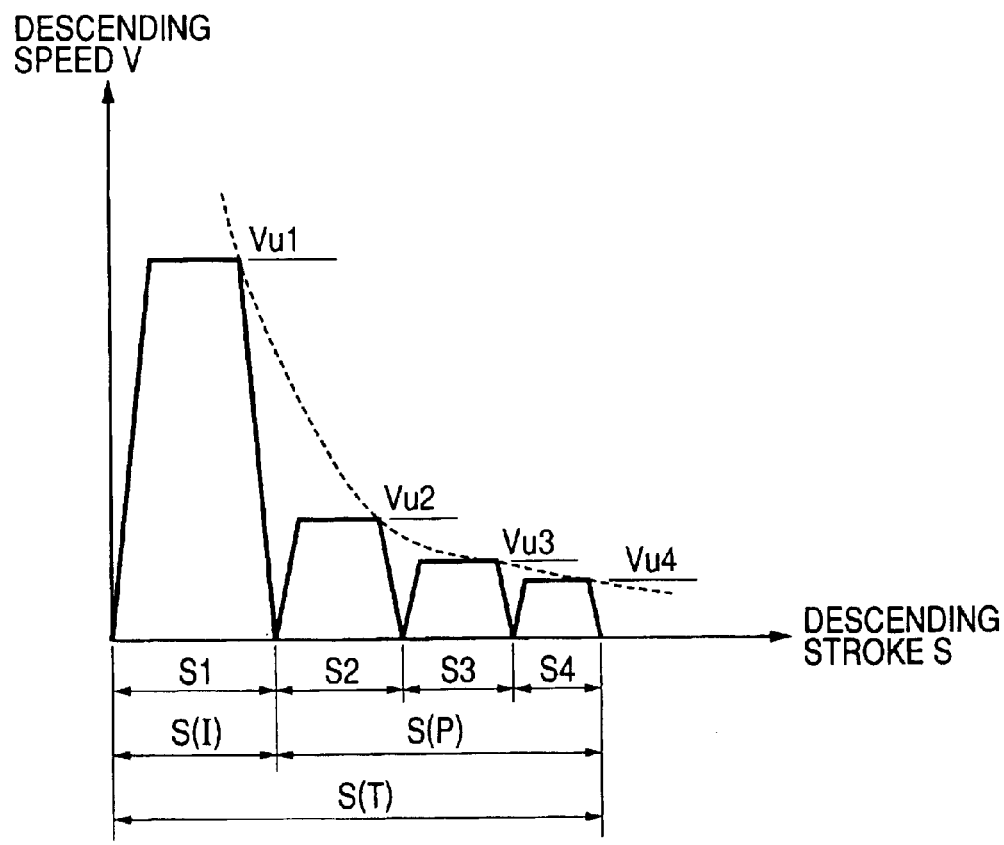
FIG. 4A to FIG. 4C are a diagram and figures for explaining a plate separating operation in the screen printing operation according to one embodiment of the invention.
Figure 4B:
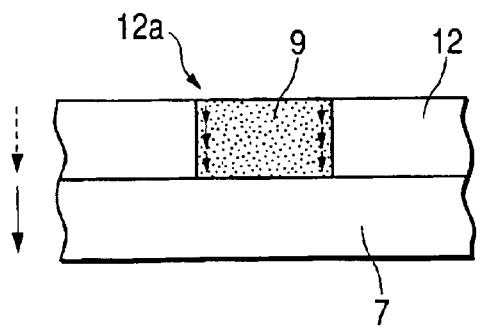
Figure 4C:
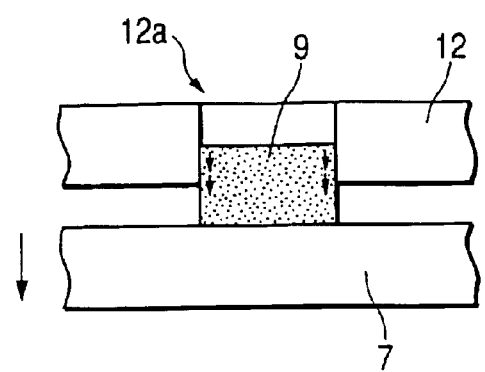

As shown first in FIG. 3A, the substrate 7 on the substrate receiving portion 6 is put between the dampers 8 and held by them, and the Z-axis table 5 is driven to raise the substrate receiving portion 6. Hereby, the substrate 7 ascends and comes into contact with the lower surface of the mask plate 12 (mask attachment step). At this time, the upper surface of the substrate 7 is raised more by a predetermined margin h to press from below from the normal height position of the lower surface of the mask plate 12, so that the contact between the substrate 7 and the mask plate 12 is in a state under pressure from below.

Figure 3B:
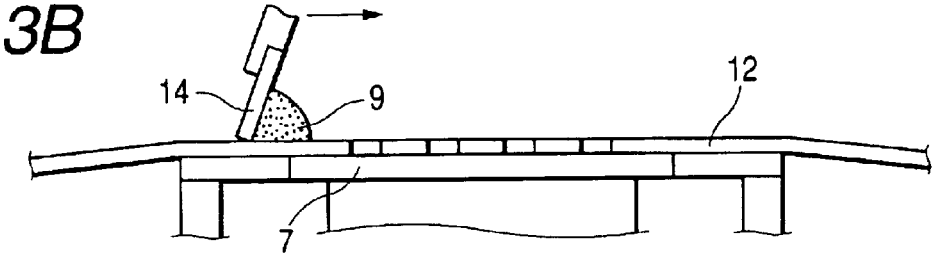
Figure 3C:
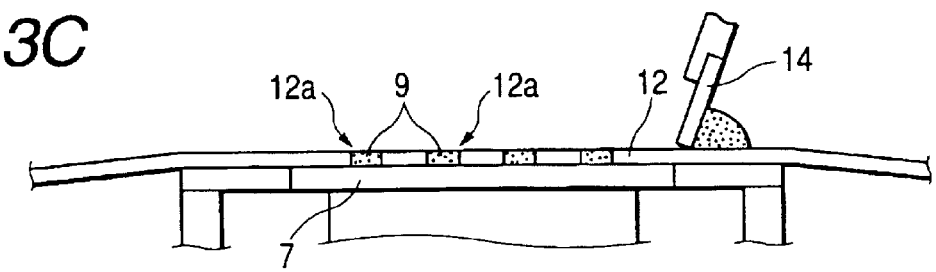

As shown next in FIG. 3B, the squeegee 14 is brought into contact with the mask plate 12, and the squeegee 14 is moved horizontally in a state where the solder cream 9 is supplied onto the mask plate 12. By this squeegeeing operation, as shown in FIG. 3C, the solder cream 9 is filled into each pattern hole 12a (squeegeeing step).

Figure 3D:
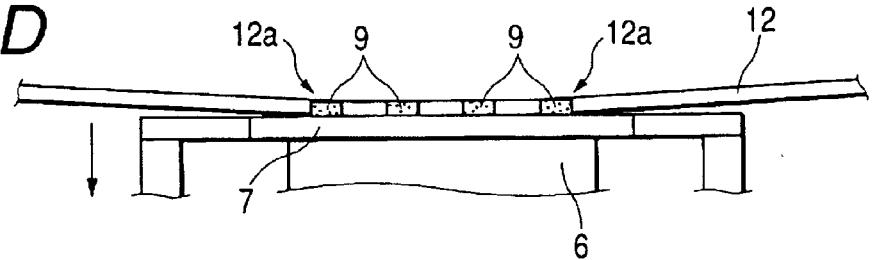

Next, the plate separating operation is performed. Namely, the Z-axis table 5 is driven to cause the substrate receiving portion 6 to descend, and the substrate 7 is separated from the lower surface of the mask plate 12 in a state where the solder cream 9 filled into the pattern hole 12 is kept adhered onto the substrate 7. At this time, as shown in FIG. 3D, the separation of the substrate 7 from the mask plate 12 is started from the peripheral portion of the substrate 7. When the separation at the peripheral portion is started, the center portion of the substrate 7 is kept adhered to the mask plate closely.

Figure 3E:
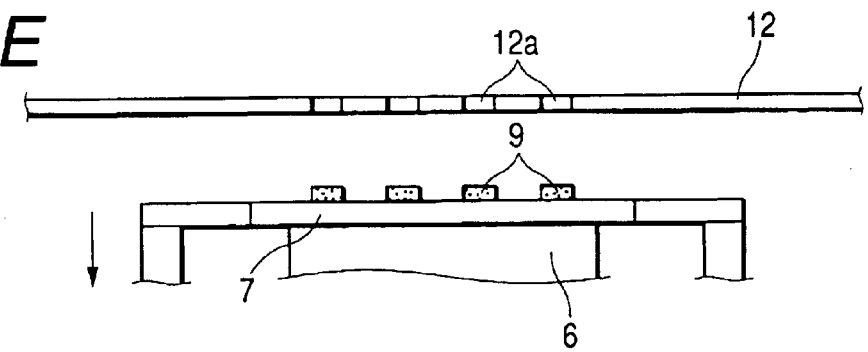

Thereafter, the substrate receiving portion 6 is caused to descend more, whereby, as shown in FIG. 3E, the mask plate 12 separates from the upper surface of the substrate 7 in the entire range of the substrate 7, and the plate separation is performed stepwise (plate separation step). Hereby, the screen printing operation of printing the solder cream 9 on the upper surface of the substrate 7 is completed.

Referring next to FIG. 4A to FIG. 4C, an operation pattern of the plate separating operation in the above screen printing operation will be described. FIG. 4A shows a speed pattern of the Z-motor 19 in this plate separating operation. Here, the plate separating operation is determined by a relation between descending stroke S showing the descending amount when the substrate receiving portion 6 is caused to descend and descending speed V.

This plate separating operation pattern is a form in which a moving speed (descending speed V) at which the substrate 7 is moved in the descending direction (in the direction where the substrate 7 is separated from the mask plate 12) is increased and decreased plural times in accordance with a regular pattern. Namely, as shown in FIG. 4A, while the substrate 7 gradually descends in order of strokes S1, S2, S3, and S4 from start of descent, an acceleration and deceleration pattern in which the descending speed V is accelerated up to each of upper limit speeds Vu1, Vu2, Vu3, and Vu4 and thereafter decelerated up to a lower limit speed (zero speed) is repeated plural times.

A stroke S1 corresponds to an initial stroke S (I) in start of the plate separating operation, and the total of strokes S2, S3, and S4 corresponds to a succeeding stroke S (P) obtained by subtracting the initial stroke S (I) from the whole descending stroke S (T). Here, the whole descending stroke S (T) corresponding to a stroke necessary for the solder cream 9 filled into the pattern hole 12a to separate from the pattern hole 12a completely in the plate separating operation. Namely, the substrate 7 descends by the whole descending stroke S (T), whereby the plate separating operation is completed, and thereafter the substrate 7 descends speedily up to a height for substrate transportation.

Here, the upper limit speed Vu1 in the first acceleration and deceleration is set higher than the upper limit speed Vu2, Vu3, and Vu4 in the succeeding acceleration and deceleration. Namely, in this plate separating operation pattern, the initial upper limit speed (Vu1) representing the upper limit speed in start of the plate separating operation is set higher than the succeeding upper limit speeds (Vu2, Vu3, and Vu4) representing the upper limit speeds from the middle of the plate separating operation on. The succeeding upper limit speeds Vu2, Vu3, and Vu4 show a pattern (refer to a curve shown by a broken line in the figure) in which degree of deceleration becomes lower as the descending stroke increases, and they are set so that gentler deceleration is performed in order. In other words, in this plate separating operation, the plural acceleration and deceleration patterns are set so that the succeeding upper limit speeds descend gradually.

FIG. 4B and FIG. 4C show the relative motion between the substrate 7 and the mask plate 12, and a motion of the solder cream 9 into the pattern hole 12a respectively in the initial stroke S (I) and the succeeding stroke S (P). In the initial stroke S (I) shown in FIG. 4B, since the high acceleration acts due to the acceleration and deceleration of high upper limit speed Vu1, impulsive shearing force acts on the contact surface between the inner surface of the pattern hole 12a and the filled solder cream 9, whereby the viscosity of the solder cream 9 in the vicinity of the contact surface lowers large.

In this initial stroke S (I), since the contact between the substrate 7 and the mask plate 12 is in a state under pressure from below at the squeegeeing time, the mask plate 12 moves nearly in accordance with the descent of the substrate 7, and the upper surface of the substrate 7 has not started the separation from the lower surface of the mask plate 12 yet. Therefore, the decrease in viscosity of the solder cream 9 is produced in the entire range of the substrate 7. Namely, in the start of the plate separating operation in which the substrate 7 descends by the initial stroke S (I), it is possible to improve uniformly plate separativeness when the solder cream 9 separates from the pattern hole 12a throughout the entire printing range of the substrate 7.

Further, in the succeeding stroke S (P), as the substrate 7 descends over the margin h to press from below shown in FIG. 3A, the substrate 7 starts the separation from the mask plate 12 as shown in FIG. 4B. At this time, since the substrate 7 descends while it is repeating the acceleration and deceleration, the impulsive shearing force acts on the contact surface between the inner surface of the pattern hole 12a and the filled solder cream 9 repeatedly, whereby the decrease of the viscosity of the solder cream 9 in the vicinity of the contact surface continues also in the succeeding stroke S (P). Therefore, even in case that the invention is applied to the substrate in high-density printing such as the solder cream printing for bump formation, the plate separating operation without disadvantage can be realized, so that a good printing result can be obtained.

Figure 5A:
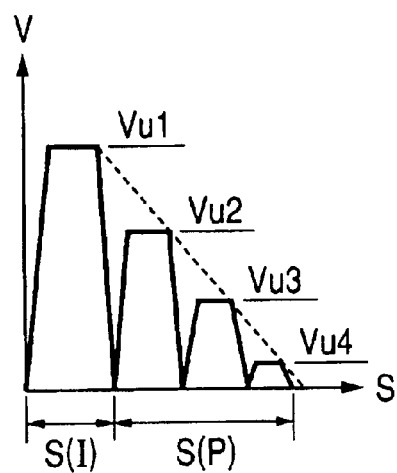
FIG. 5A to FIG. 5C are diagrams showing plate separating operation patterns in the screen printing operation according to one embodiment of the invention.
Figure 5B:
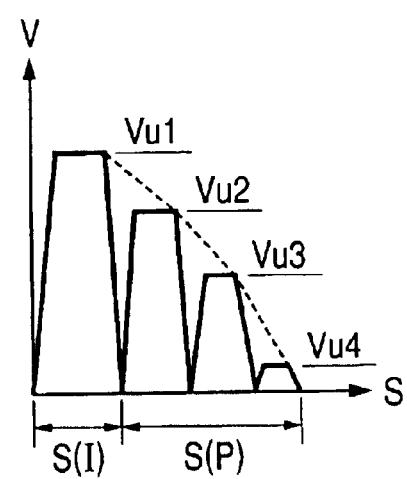
Figure 5C:
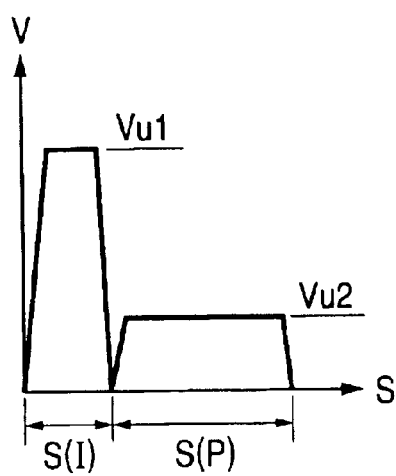

FIG. 5A to FIG. 5C and FIG. 6 show other examples of the plate separating pattern. FIG. 5A to FIG. 5C shows three pattern examples which are different in combination of the upper limit speeds in the acceleration and deceleration pattern in the succeeding stroke S (P). FIG. 5A shows an example in which plural acceleration and deceleration patterns (refer to a linear line shown by a broken line in the figure) are set so that the succeeding upper limit speeds Vu2, Vu3, and Vu4 lower lineally as the descending stroke increases. FIG. 5B shows an example in which plural acceleration and deceleration patterns (refer to a curve shown by a broken line in the figure) are set so that degree of the deceleration of the succeeding upper limit speeds Vu2, Vu3, and Vu4 increases as the descending stroke increases. Further, as shown in FIG. 5C, in the succeeding stroke S (P), the substrate 7 may be caused to descend at a constant speed V2 that is lower than the initial upper limit speed Vu1.

Figure 6:
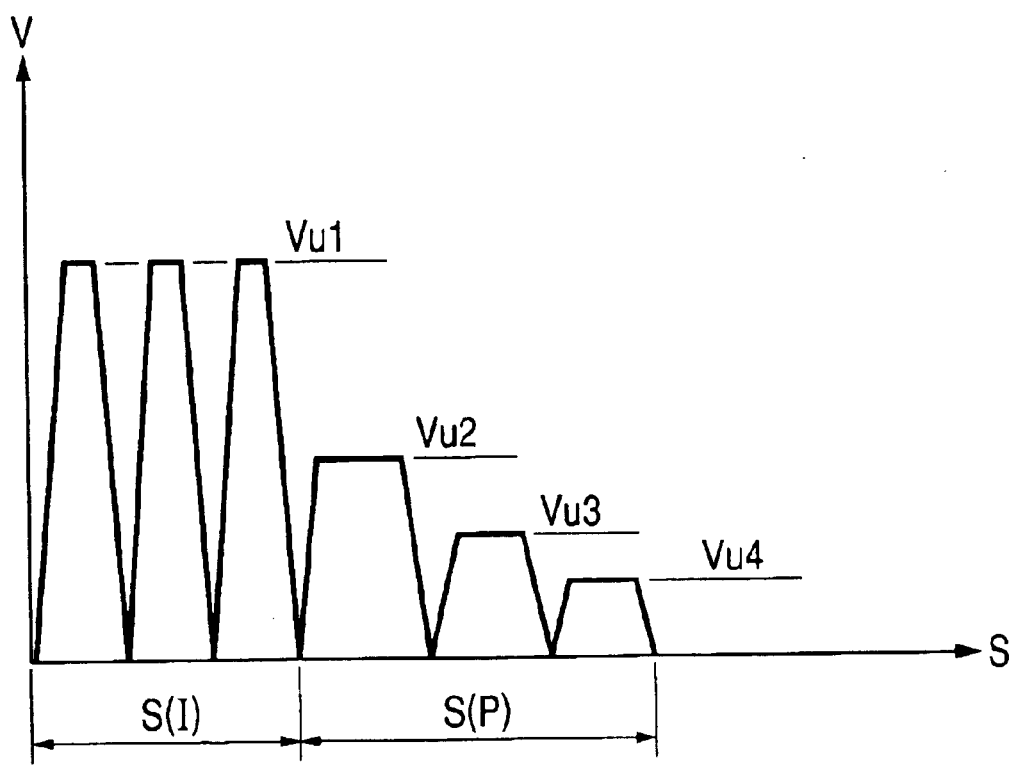
FIG. 6 is a diagram showing a plate separating operation pattern in the screen printing operation according to one embodiment of the invention.
Figure 7A:
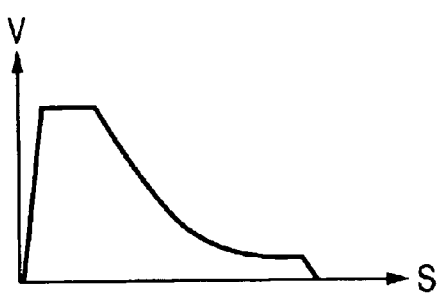
FIG. 7A to FIG. 7E are diagrams showing plate separating operation patterns in the screen printing operation according to one embodiment of the invention.
Figure 7B:
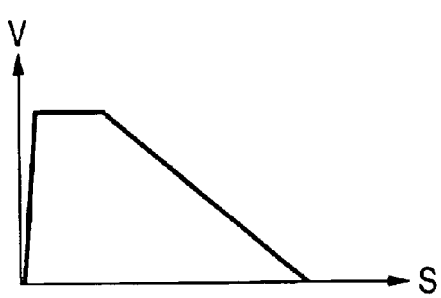
Figure 7C:
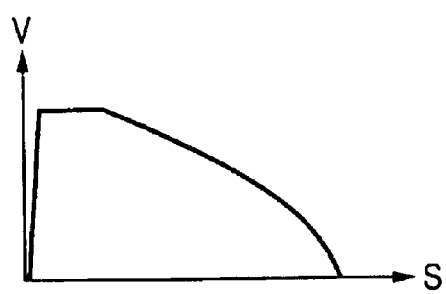
Figure 7D:
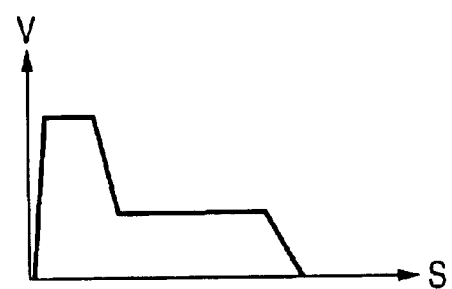
Figure 7E:
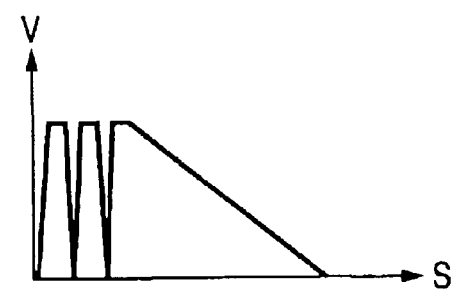

FIG. 6 shows an example in which plural acceleration and deceleration patterns are set so that acceleration and deceleration is repeated at the same initial upper limit speed Vu1 for a short time in the initial stroke S (I) and thereafter the succeeding upper limit speeds Vu2, Vu3, and Vu4 lower gradually. In this example, high acceleration acts repeatedly on the solder cream 9 into the pattern hole 12a in the start of the plate separating operation. Therefore, the viscosity of the solder cream 9 in the contact surface with the pattern hole 12a can be lowered sharply, so that the plate separativeness improves very much.

In the acceleration and deceleration patterns shown in FIGS. 4A to FIG. 6, the lower limit speed is set to zero and the descending operation is stopped momentarily. However, it is not always necessary to set the lower limit speed to zero. Namely, as long as such a acceleration and deceleration condition is set that a shock is given to the solder cream 9 into the pattern hole 12a by the sharp acceleration and deceleration produced by accelerating the descending speed up to the upper limit speed after decelerating the descending speed, the lower limit speed may be set to any value.

As described above, in the screen printing method shown in the embodiment, the acceleration and deceleration is performed at the high upper limit speed in start of the plate separating operation, whereby the impulsive acceleration is applied to the solder cream 9 into the pattern hole 12a, so that the viscosity of the solder cream 9 lowers.

Hereby, even in case that the thin mask plate in which the pattern holes are formed at the high density is used like printing of solder cream for formation of solder bump, the problem produced in the conventional screen printing, that is, unevenness of plate separating condition caused by time delay of the partial substrate in separation between the substrate and the mask plate is not produced, so that it is possible to secure the uniform quality of printing.

In the acceleration and deceleration patterns shown in FIG. 4A to FIG. 6, in the deceleration process after the moving speed is raised up to the upper limit speed in start of the plate separating operation, the acceleration and deceleration is repeated again. However, this deceleration process may be performed with patterns shown in FIG. 7A to FIG. 7E. Namely, as shown in FIG. 7A, FIG. 7B, FIG. 7C, FIG. 7D, and FIG. 7E, in the deceleration process after the moving speed is raised up to the upper limit speed in start of the plate separating operation, deceleration is performed continuously without repeating the acceleration and deceleration.

Here, the patterns shown in FIG. 7A, FIG. 7B, FIG. 7C, FIG. 7D, and FIG. 7E correspond respectively to the acceleration and deceleration patterns shown in FIG. 4A, FIG. 5A, FIG. 5B, FIG. 5C, and FIG. 6, and they are patterns in which in these acceleration and deceleration patterns, the moving speed is continuously decelerated in accordance with an envelope curve (refer to broken lines shown in FIGS. 4, 5A and 5B) connecting the succeeding upper limit speeds. Also in such the acceleration and deceleration patterns, the impulsive acceleration is applied to the solder cream 9 into the pattern hole 12a in the start of the plate separating operation, so that the viscosity of the solder cream 9 lowers.

According to the invention, in start of the plate separating operation of moving the work in the direction where the work separates from the mask plate, the moving speed is accelerated up to the upper limit speed and thereafter is decelerated up to the lower limit speed, whereby viscosity of the paste into the pattern hole is lowered in start of the plate separating operation, and good plate separativeness can be secured throughout the entire range of the substrate. Further, preferably, the upper limit speed in start of the plate separating operation of repeating plural times the acceleration and deceleration pattern in which the moving speed at which the work is moved in the direction where the work separates from the mask plate is accelerated up to the upper limit speed and thereafter is decelerated up to the lower limit speed is set higher than the succeeding upper limit speeds from the middle of the plate separating operation on, whereby better plate separativeness can be secured.

What is claimed is:

1. A screen printing method for printing paste on a work via pattern holes formed on a mask plate, comprising:

a mask attachment step in which said work is brought into contact with the a lower surface of said mask plate;

a squeegeeing step in which a squeegee is moved on the mask plate in the mask attachment state thereby to filling paste into said pattern holes; and a plate separating step in which the work is separated from the mask plate stepwise by a plate separating operation of repeating plural times an acceleration and deceleration pattern in which a moving speed at which said work is moved in the direction where the work separates from the mask plate is accelerated up to an upper limit speed and thereafter is decelerated up to a lower limit speed, wherein an initial upper limit speed representing said upper limit speed in start of said plate separating operation is set higher than succeeding upper limit speeds representing the upper limit speeds from the middle of the plate separating operation on, wherein in said plate separating operation, a plurality of said acceleration and deceleration patterns are set so that said succeeding upper limit speed are decelerated gradually.

2. The screen printing method according to claim 1, wherein in the plate separating operation, said work is separated from the mask plate by causing the work to descend.

3. A screen printing method for printing paste on a work via pattern holes formed on a mask plate, comprising:

a mask attachment step in which said work is brought into contact with the lower surface of said mask plate;

a squeegeeing step in which a squeegee is moved on the mask plate in the mask attachment state thereby to filling paste into said pattern holes; and a plate separating step in which the work is separated from the mask plate stepwise by a plate separating operation of repeating plural times an acceleration and deceleration pattern in which a moving speed at which said work is moved in the direction where the work separates from the mask plate is accelerated up to an upper limit speed and thereafter is decelerated up to a lower limit speed, wherein an initial upper limit speed representing said upper limit speed in start of said plate separating operation is set higher than succeeding upper limit speeds representing the upper limit speeds from the middle of the plate separating operation on, wherein in start of said plate separating operation, a plurality of said acceleration and deceleration patterns are set so that acceleration and deceleration is repeated at the nearly equal initial upper limit speed.

4. A screen printing method for printing paste on a work via pattern holes formed on a mask plate, comprising:

a mask attachment step in which said work is brought into contact with the lower surface of said mask plate;

a squeegeeing step in which a squeegee is moved on the mask plate in the mask attachment state thereby to filling paste into said pattern holes; and a plate separating step in which a plate separating operation of moving said work in the direction where the work separates from the mask plate is performed, wherein in start of said plate separating operation, the moving speed is accelerated up to an upper limit speed and thereafter is decelerated up to a lower limit speed, wherein in start of said plate separating operation, a plurality of acceleration and deceleration patterns are set so that acceleration and deceleration is repeated at nearly equal the upper limit speed, and wherein thereafter deceleration is performed continuously until said plate separating operation is completed.

5. The screen printing method according to claim 4, wherein in the plate separating operation, said work is separated from the mask plate by causing the work to descend.

6. A screen printing method for printing paste on a work via pattern holes formed on a mask plate, comprising:

a mask attachment step in which said work is brought into contact with the lower surface of said mask plate;

a squeegeeing step in which a squeegee is moved on the mask plate in the mask attachment state thereby to filling paste into said pattern holes; and a plate separating step in which a plate separating operation of moving said work in the direction where the work separates from the mask plate is performed, wherein in start of said plate separating operation, the moving speed is accelerated up to an upper limit speed and thereafter is decelerated up to a lower limit speed, wherein in a process where in start of said plate separating operation, the moving speed is accelerated up to the upper limit speed and thereafter is decelerated up to the lower limit speed, acceleration and deceleration are not repeated but deceleration is performed continuously until said plate separating operation is completed.

* * * * *